United States Patent
Bartalini et al.

(10) Patent No.: US 9,939,829 B2
(45) Date of Patent: Apr. 10, 2018

(54) LOW-NOISE CURRENT SOURCE INCLUDING ONE OR MORE CURRENT GENERATOR MODULES

(71) Applicants: CONSIGLIO NAZIONALE DELLE RICERCHE, Rome (IT); UNIVERSITÀ DEGLI STUDI DI FIRENZE, Florence (IT)

(72) Inventors: Saverio Bartalini, Rome (IT); Alessio Montori, Rome (IT); Marco De Pas, Sesto Fiorentino (IT); Mauro Giuntini, Sesto Fiorentino (IT); Paolo De Natale, Rome (IT)

(73) Assignees: CONSIGLIO NAZIONALE DELLE RICERCHE, Rome (IT); UNIVERSTÀ DEGLI STUDI DI FIRENZE, Florence (IT)

( * ) Notice: Subject to any disclaimer, the term of this patent is extended or adjusted under 35 U.S.C. 154(b) by 0 days.

(21) Appl. No.: 15/523,499

(22) PCT Filed: Oct. 29, 2015

(86) PCT No.: PCT/IB2015/058351
§ 371 (c)(1),
(2) Date: May 1, 2017

(87) PCT Pub. No.: WO2016/067241
PCT Pub. Date: May 6, 2016

(65) Prior Publication Data
US 2017/0315573 A1    Nov. 2, 2017

(30) Foreign Application Priority Data

Oct. 31, 2014    (IT) .............................. RM2014A0626

(51) Int. Cl.
| | | |
|---|---|---|
| *G05F 1/56* | (2006.01) | |
| *H01S 5/042* | (2006.01) | |
| *H01S 5/34* | (2006.01) | |

(52) U.S. Cl.
CPC ................ *G05F 1/56* (2013.01); *H01S 5/042* (2013.01); *H01S 5/3401* (2013.01)

(58) Field of Classification Search
CPC ....................................................... G05F 1/56
(Continued)

(56) References Cited

U.S. PATENT DOCUMENTS 5,905,369 A * 5/1999 Ishii .................... H02M 3/1584
323/222
5,959,413 A * 9/1999 Komarek .............. H04M 1/723
315/169.3
(Continued)

FOREIGN PATENT DOCUMENTS

| EP | 2 730 990 | 5/2014 |
| WO | WO 2008/060469 | 5/2008 |

OTHER PUBLICATIONS

International Search Report for PCT/IB2015/058351, dated Feb. 4, 2016, 3 pages.
(Continued)

*Primary Examiner* — Adolf Berhane
*Assistant Examiner* — Nusrat Quddus
(74) *Attorney, Agent, or Firm* — Nixon & Vanderhye P.C.

(57) ABSTRACT

Low-noise current source, configured to be supplied by at least one DC main supply ($V_{ss}$) and to deliver an output current ($I_L$), the source comprising one or more current generator modules ($G_1, G_2, \ldots G_N$) operating in parallel each one of which is configured to deliver a respective output current ($I_i$), whereby the output current ($I_L$) of the
(Continued)

(a)

(b)

source is equal to the sum of the output currents ($I_i$) of said one or more current generator modules ($G_1, G_2, \ldots G_N$), each current generator module ($G_1; G_2; \ldots G_N$) comprising a regulator component (Q1), configured to deliver the output current ($I_i$) of the current generator module ($G_1; G_2; \ldots G_N$), a sensing resistor ($R_s$) connected in series to the regulator component (Q1), and an error amplifier stage (IC1), configured to compare a reference voltage ($V_{ref}$) with a voltage drop ($V_s$) across the sensing resistor ($R_s$), whereby the error amplifier stage (IC1) is configured to amplify an error signal equal to a difference between the between voltage ($V_{ref}$) and voltage across the sensing resistor ($R_s$), the error amplifier stage (IC1) being configured to output the amplified error signal that is configured to control the regulator component (Q1), the current source being characterized in that each current generator module ($G_1; G_2; \ldots G_N$) further comprises a first shunt type regulator (Z1, I1), configured to be connected to said at least one DC main supply ($V_{ss}$), that is further configured to generate a dedicated supply voltage supplying the error amplifier stage (IC1), whereby the error amplifier stage (IC1) is configured to be supplied in a floating manner with respect to said at least one DC main supply ($V_{ss}$).

15 Claims, 5 Drawing Sheets

(58) Field of Classification Search
USPC .......................................... 323/265–289, 351
See application file for complete search history.

(56) References Cited

U.S. PATENT DOCUMENTS

| | | | | |
|---|---|---|---|---|
| 7,595,569 | B2* | 9/2009 | Amerom | G06F 1/263 307/58 |
| 8,742,744 | B2* | 6/2014 | Abu Qahouq | H02M 3/156 323/285 |
| 2005/0057236 | A1* | 3/2005 | Telecco | G05F 1/465 323/274 |
| 2008/0136386 | A1* | 6/2008 | Nastase | G05F 1/575 323/275 |
| 2008/0284394 | A1* | 11/2008 | Yin | G05F 1/575 323/282 |
| 2008/0284395 | A1* | 11/2008 | Wang | G05F 1/56 323/282 |
| 2009/0128107 | A1* | 5/2009 | Wang | G05F 1/575 323/280 |
| 2013/0278153 | A1 | 10/2013 | Pi | |

OTHER PUBLICATIONS

Zhao et al., "High-Side Current Sensing with Wide Dynamic Range: Three Solutions", Analog Dialogue, Dec. 1, 2010, pp. 1-5, XP055201133.

Zhao et al., "High-Side Current Sensing with Wide Dynamic Range: Three Solutions," Analog Dialogue 44-12, Dec. 2010, pp. 1-5 (XP055201133).

* cited by examiner

LOW-NOISE CURRENT SOURCE INCLUDING ONE OR MORE CURRENT GENERATOR MODULES

This application is the U.S. national phase of International Application No. PCT/IB2015/058351 filed 29 Oct. 2015, which designated the U.S. and claims priority to IT Patent Application No. RM2014A000626 filed 31 Oct. 2014, the entire contents of each of which are hereby incorporated by reference.

The present invention concerns a current source, in particular configured to drive quantum cascade lasers (in the following also indicated as QCL), optionally in the region of the mid-infrared spectrum, i.e. in the frequency band of the TeraHertz (THz) order, that allows in an efficient, reliable, simple and inexpensive way to provide a load with a very low noise output current with excellent long term stability making an extremely high compliance voltage, of the order of tens of volts, available across the load (where the compliance voltage, as known by those skilled in the art, is the maximum output voltage that the source may provide when delivering the desired current).

In the following reference will be mainly made to an application of the current source according to the invention wherein the latter drives a QCL in the region of the mid-infrared spectrum or in the far infrared one, also called TeraHertz (THz) one, that is connected to the output of the source operating as load of the latter. However, it must be understood that the current source according to the invention may be used in any application for driving any load, even different from a QCL, still remaining within the scope of protection of the present invention as defined in the attached claims.

It is known that the quantum cascade lasers are solid state lasers having optimal spectral purity properties and that, for this reason, they have had in the recent decades an increasing diffusion, for instance in high precision and sensitivity spectroscopy and imaging applications. For technological reasons, the solid state lasers usually have an end connected to the case that is in turn connected to ground, whereby even the QCLs are used either in Anode-Ground configuration, wherein the laser anode is connected to the case and consequently to ground, or in Cathode-Ground configuration, wherein the laser cathode is connected to the case and consequently to ground.

Figure 1:
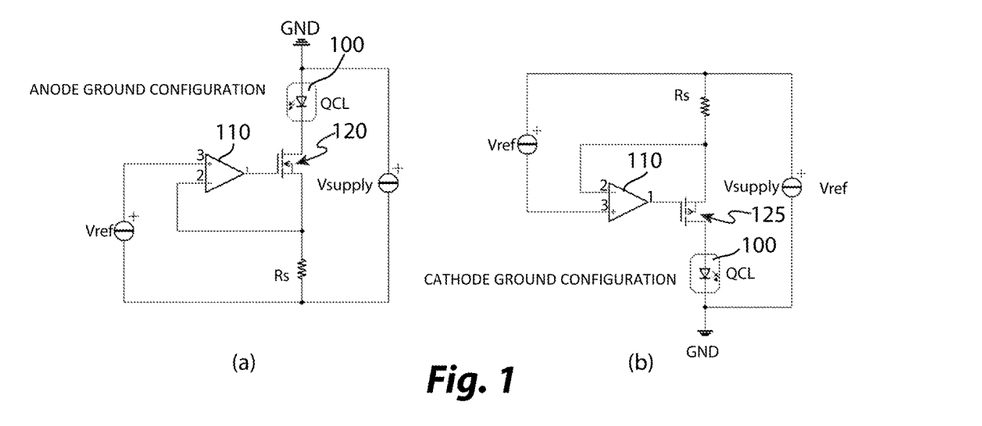
FIG. 1 shows a schematic representation of a first prior art current source (FIG. 1a) and of a second prior art current source (FIG. 1b)

Given the heavy dependency of the QCL optical frequency on the current, in the prior art very low noise and excellent long term stability current sources have been developed for driving QCLs. In particular, FIG. 1 shows a schematic representation (immediately comprehensible to those skilled in the art) of the basic arrangements of prior art current sources configured to drive a QCL in Anode-Ground configuration (FIG. 1a), as proposed by M. S. Taubman and T. Myers in "Precision control of multiple quantum cascade lasers for calibration systems", Rev. Sci. Instrum. 85, 2014, 014704, and a QCL in Cathode-Ground configuration (FIG. 1b) similar to what proposed for generic laser diodes by K. G. Libbrecht and J. L. Hall in "A low-noise high-speed diode laser current controlled", Rev. Sci. Instrum. 64 (8), August 1993, pp. 2133-2135, and by C. J. Erickson et al. in "An ultrahigh stability, low-noise laser current driver with digital control", Rev. Sci. Instrum. 79, 2008, 073107.

It may be observed that in both the arrangements of FIG. 1 the output current given to the QCL 100 is monitored through the voltage drop across a sensing resistor $R_s$ placed in series to the QCL 100, voltage drop that is compared with a reference voltage $V_{ref}$ through an operational amplifier 110 that receives at its inputs such two voltages to compare (namely the reference voltage $V_{ref}$ at the non-inverting input and the voltage drop $V_s$ across the sensing resistor $R_s$ at the inverting input) and that outputs an error signal; in particular, the sensing resistor $R_s$, the source of the reference voltage $V_{ref}$ and the operational amplifier 110 are part of a regulation loop. The output of the operational amplifier 110 is connected to the gate of a regulating MOSFET, whereby the error signal output by the operational amplifier 110 controls the gate (and hence the operation) of the regulating MOSFET (n-channel enhancement MOSFET in FIG. 1a, indicated by the reference numeral 120, and p-channel enhancement MOSFET in FIG. 1b, indicated by the reference numeral 125), interposed in the series branch including QCL 100 and resistor $R_s$, which MOSFET operates as regulator. On the series branch including QCL 100 and resistor $R_s$ the output current $I_L$ is fixed at a value equal to $$I_L = \frac{V_{ref}}{R_s}$$

independently from the load impedance.

Figure 2A:
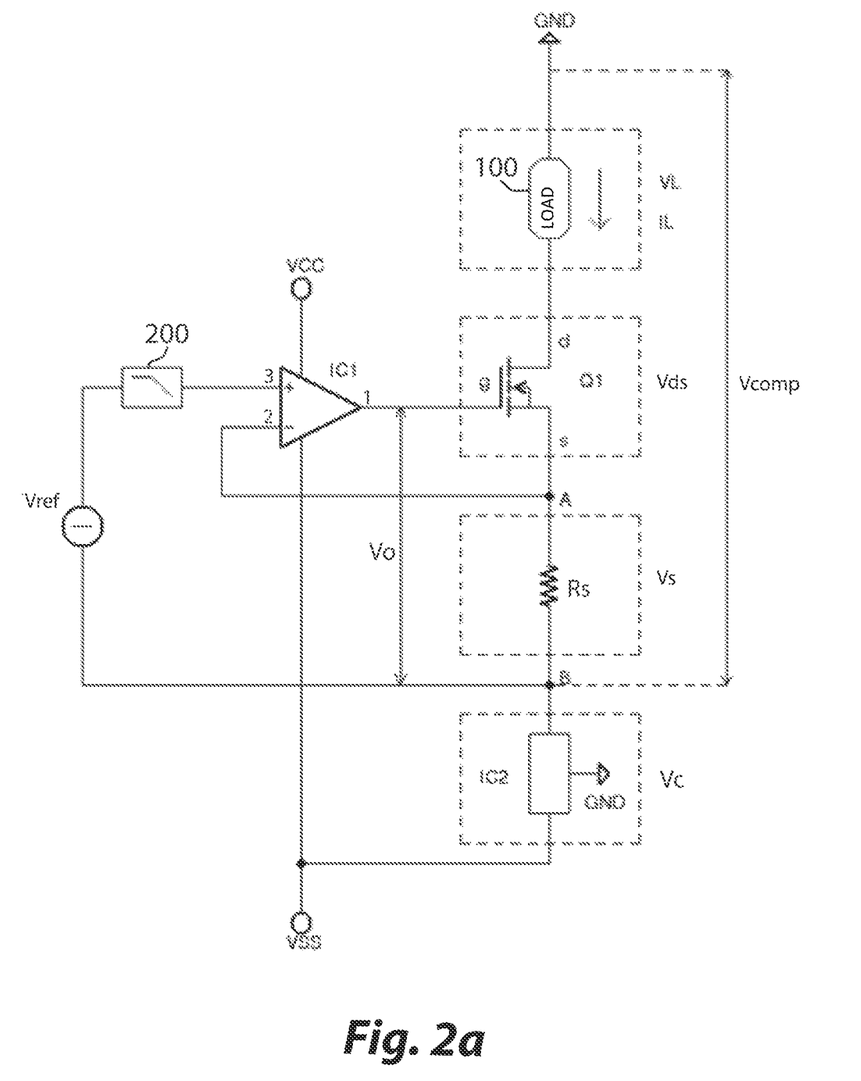

FIG. 2a shows a circuit diagram of greater detail of the arrangement of the current source of FIG. 1a, i.e. configured to drive a QCL in Anode-Ground configuration that is represented in FIG. 2a by a generic load (still indicated by the reference numeral 100), wherein the regulating MOSFET is indicated by the reference sign Q1 and the operational amplifier is indicated by the reference sign IC1 and is supplied by a dual supply, i.e. with a positive supply voltage $V_{cc}$ and a negative supply voltage $V_{ss}$. The source of the reference voltage $V_{ref}$ is connected to the non-inverting terminal of the operational amplifier IC1 through a low-pass filter 200, and a voltage regulator IC2 is connected between the negative supply voltage $V_{ss}$, and node B that constitutes an end of the sensing resistor $R_s$ and, more generally, an end of the series branch including load 100, MOSFET Q1 and sensing resistor $R_s$ and the other end of which is connected to circuit ground; in particular, the regulator IC2 is used to obtain the compliance voltage $V_{comp}$, and the voltage drop across the same guarantees the control of the output current $I_L$ for low values of $I_L$.

Figure 2B:
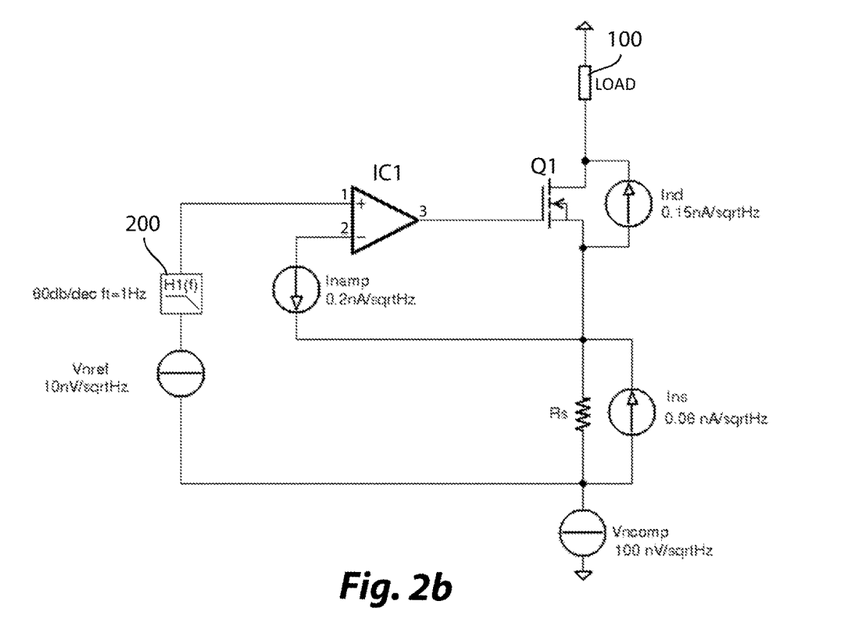

Making reference to the simplified circuit diagram shown in FIG. 2b for carrying out an analysis of the current noise, it may be observed that the noise introduced by the operational amplifier, the noise introduced by the source of the reference voltage $V_{ref}$ and the thermal noise of the sensing resistor $R_s$ contribute to the current noise $N_{int}$ due to noise sources internal to the regulation loop, while the noise of the compliance voltage $V_{comp}$ and the noise introduced by the regulating MOSFET Q1 contribute to the current noise $N_{ext}$ due to noise sources external to the regulation loop.

The regulation loop treats the external noise sources differently from the internal ones. Indicating the closed loop transfer function with G(f), the total noise $N_{tot}$ is given by:

$$N_{tot} = G(f) N_{int} + (1 - G(f)) N_{ext} \qquad [1]$$

with G(f) tending to 1 within the regulation frequency band and to 0 outside the regulation band.

Consequently, within the regulation band, the external noise sources are heavily attenuated by the loop and the resulting noise may be neglected. Differently, the contribution from the internal noise sources is significant and is analysed in the following.

A typical operational amplifier with ultra-low noise classification has input current noise density $I_{iamp}$ of the order of few pA/√Hz and voltage noise density $V_{namp}$ of the order of 1 nV/√Hz. Therefore, the total noise introduced by the operational amplifier IC1 to the current is equal to:

$$(I_{namp})^2 = (I_{iamp})^2 + (V_{namp}/R)^2 \quad [2]$$

where R is the resistance of the sensing resistor $R_s$. Considering a typical value of 5 Ohm for R, the contribution of the current noise is neglectable with respect to the contribution of the voltage noise, whereby the density of total current noise introduced by the operational amplifier IC1 is mainly due to the voltage noise density $V_{namp}$; in particular, a typical value of such noise density is equal to $$I_{namp} = V_{namp}/R = 0.2 \text{ nA}/\sqrt{Hz} \quad [3]$$

The density $V_{ref}$ of noise introduced by the source of the reference voltage $V_{ref}$ is of the order of 10 nV/√Hz. Since a wide pass-band for the regulation of the operating point of the laser is not required, the reference voltage $V_{ref}$ may be filtered so as to reduce the density $V_{nref}$. For instance, considering a noise density $V_{nref} = 10$ nV/√Hz, it is possible to filter the reference voltage $V_{ref}$ with a low-pass filter 200, optionally a third order filter having transfer function H1(*f*) with slope equal to 60 dB/dec and cut-off frequency equal to 1 Hz. The contribution to the total current noise density due to $V_{nref}$ is given by:

$$I_{nref} = \frac{V_{nref} H1(f)}{R} \quad [4]$$

where the low-pass filter 200 cuts the input signal (i.e. the reference voltage $V_{ref}$) proportionally to $1/f^3$, whereby the pattern of the response of the low-pass filter 200 is inversely proportional to the cube of the frequency and $$I_{nref} < 0.01 \text{ nA}/\sqrt{Hz} \text{ per } f > 10 \text{ Hz} \quad [5]$$

With regard to the thermal noise introduced by the sensing resistor $R_s$, in the case where the current delivered by the generator is maximum, the resistors usually work at an equilibrium temperature around 320K, whereby, assuming that the value of the resistance R of the resistor $R_s$ is equal to 5 Ohm, the thermal contribution of the sensing resistor $R_s$ is equal to:

$$I_{ns} = \sqrt{\frac{4KT}{R}} \simeq 0.06 \text{ nA}/\sqrt{Hz} \quad [6]$$

Comparing the equations [3], [5] and [6], it is possible to observe that the noise introduced by the operational amplifier IC1 of the regulation loop is dominant (this remains valid even in the case where the low-pass filter 200 were a filter of order lower than the third one, e.g. a second order filter). Consequently, for obtaining good performance, the operational amplifier IC1 must have a low input noise density $V_{namp}$.

In order to reduce the noise of the amplifier of FIG. 2a, it is also possible to increase the value of the resistance R of the sensing resistor $R_s$, since the higher such value, the lower the current noise density is, as shown by equation [3].

However, the noise reduction through the increase of the value of the resistance R of the sensing resistor $R_s$ entails an increase of the power dissipated by the same sensing resistor $R_s$.

Moreover, the arrangement of the current source of FIG. 2a suffers from further drawbacks entailing limits with loads, i.e. with QCL 100, requiring high output currents $I_L$ and voltages $V_L$ applied to the load. In fact: the load 100 requires, as a minimum requirement, a maximum output current $I_L$ of 2 A with a voltage drop $V_L$ of 20 V; the MOSFET Q1, for the operation in the linear region, typically requires a voltage $V_{ds}$ across the drain and source terminals ranging from about 2.5 V to about 3 V; and the sensing resistor $R_s$ must have a value of about 5 Ohm for obtaining an adequate reduction of the noise, whereby a current of 2 A generates a maximum voltage drop $V_{Rs}$ across the sensing resistor $R_s$ equal to about 10 V.

As stated, the voltage drop caused by the voltage regulator IC2 guarantees the control of the output current $I_L$ for low values of the same current $I_L$. As known to those skilled in the art, the current $I_L$ flowing in the MOSFET Q1 is given by a relationship of the following type:

$$I_L \simeq G(V_{gs} - V_{th}) \quad [7]$$

wherein $V_{th}$ is the threshold voltage of the MOSFET Q1 and $$V_{gs} = V_o - RI_L \quad [8]$$

where $V_o$ is the output voltage of the operational amplifier IC1. By combining the two relationships [7] and [8], the dependency of the output current $I_L$ from the output voltage $V_o$ of the operational amplifier IC1 is expressed:

$$I_L = G(V_o - V_{th})/(1 + G \cdot R) \quad [9]$$

In order to bring the output current $I_L$ to zero, it is necessary that the output voltage $V_o$ of the operational amplifier IC1 falls below the threshold voltage $V_{th}$ of the MOSFET Q1; typical values of the threshold voltage $V_{th}$ ranges from about 2 V to about 3 V.

The output voltage $V_o$ of a common low-noise operational amplifier is included in the following range:

$$V_{ss} + 3V < V_o < V_{cc} - 3V \quad [10]$$

From such relationship [10] it is possible to note that, without the voltage regulator IC2, i.e. with $V_{comp} = V_{ss}$, the output voltage $V_o$ of the operational amplifier IC1 could never fall below 3 V with respect to node B and that, consequently, the output current $I_L$ could never be zeroed. In other words, in order that the output voltage $V_o$ of the operational amplifier IC1 falls below the threshold voltage $V_{th}$ of the MOSFET Q1, it is necessary that the negative supply voltage $V_{ss}$ of the operational amplifier IC1 is lower than $V_{comp}$. Therefore, the voltage regulator IC2 guarantees an additional voltage drop $V_c$ (operating as second reference voltage), guaranteeing a good regulation of the source for low output currents $I_L$.

In view of what has been just illustrated, it is evident that the minimum negative voltage $V_{ss}$ with which it is possible to supply the operational amplifier IC1 is given by the sum of the voltages $V_L$, $V_{ds}$, $V_s$, $V_c$, and this entails that the negative supply voltage $V_{ss}$ required for the operational amplifier IC1 may easily reach and exceed the maximum supply values allowed for a common very low noise operational amplifier, typically equal to about 30 V.

This entails that, in order that the current source of FIG. 2a operates with high values of output voltage $V_L$, the operational amplifier IC1 must be supplied with high voltages, close to its maximum limits, and in these conditions the noise characteristics significantly deteriorate. Consequently, for maintaining the low noise characteristic, being capable to deliver high currents and guaranteeing high values of voltage available across the load, it is necessary to find an operational amplifier that maintains a very low noise input voltage with a high supply voltage. In other words, the good operation of the circuit is linked, in this configuration, to the specific qualities of the operational amplifier.

It must be noted that the same considerations given with reference to the arrangement of the current source of FIGS. 1a and 2a, configured to drive a QCL in Anode-Ground configuration, are also valid to the case of the arrangement of the current source of FIG. 1b, i.e. configured to drive a QCL in Cathode-Ground configuration.

It is, therefore, an object of the present invention to allow in an efficient, reliable, simple and inexpensive way to provide a load with a very low noise output current with excellent long term stability, making voltages of tens of volts available across the load, i.e. with so-called compliance voltages which are particularly high.

It is specific subject matter of the present invention a low-noise current source, configured to be supplied by at least one DC main supply and to deliver an output current, the source comprising one or more current generator modules operating in parallel each one of which is configured to deliver a respective output current, whereby the output current of the source is equal to the sum of the output currents of said one or more current generator modules, each current generator module comprising a regulator component, configured to deliver the output current of the current generator module, a sensing resistor connected in series to the regulator component, and an error amplifier stage, configured to compare a reference voltage with a voltage drop across the sensing resistor, whereby the error amplifier stage is configured to amplify an error signal equal to a difference between the between voltage and voltage across the sensing resistor, the error amplifier stage being configured to output the amplified error signal that is configured to control the regulator component, the current source being characterised in that each current generator module further comprises a first shunt type regulator, configured to be connected to said at least one DC main supply, that is further configured to generate a dedicated supply voltage supplying the error amplifier stage, whereby the error amplifier stage is configured to be supplied in a floating manner with respect to said at least one DC main supply.

In particular, the feature that the source comprises one or more current generator modules operating in parallel means that, in the case where it comprises at least two current generator modules, these are connected in parallel to each other, while in the case where the source comprises a sole current generator module, the output current of the source coincides with the output current of the sole generator module.

According to another aspect of the invention, the first shunt type regulator may comprise a first Zener diode and a first current generator connected in series to each other and configured to generate said dedicated supply voltage across the first Zener diode.

According to a further aspect of the invention, each current generator module may further comprise a second shunt type regulator, configured to be connected to said at least one DC main supply, that is further configured to generate a second reference voltage on one end of the sensing resistor not connected to the regulator component.

According to an additional aspect of the invention, the second shunt type regulator may comprise a second Zener diode and a second current generator connected in series to each other and configured to generate the second reference voltage across the second Zener diode. According to another aspect of the invention, each current generator module may further comprise an electrical switching stage, optionally comprising a switch, connected in parallel to the second Zener diode, the electrical switching stage being configured to assume an open configuration, in which it does not allow current to flow, or a closed configuration, in which it allows current to flow, upon control of a control stage, the control stage being configured to control the electrical switching stage so that, when the output current of the current generator module current generator is higher than or equal to a maximum current value $I_{max}$, in turn higher than or equal to a current threshold value $I_{th}$, the electrical switching stage assumes said closed configuration, whereby the second Zener diode is disconnected from the sensing resistor $R_s$, and so that, when the output current of the current generator module is lower than or equal to a minimum current value $I_{min}$, in turn higher than or equal to the current threshold value $I_{th}$ and lower than or equal to the maximum current value $I_{max}$, the electrical switching stage assumes said open configuration.

According to a further aspect of the invention, the error amplifier stage may comprise or consist of an operational amplifier configured to receive at a non-inverting input the reference voltage and at an inverting input the voltage drop across the sensing resistor.

According to an additional aspect of the invention, the regulator component may comprise or consist of a MOSFET the gate of which is connected to said output of the error amplifier stage, whereby the amplified error signal output by the error amplifier stage is configured to control the gate of the MOSFET.

According to another aspect of the invention, the low-noise current source may comprise a digital interface comprising a digital processing unit, optionally comprising a microprocessor, configured to regulate the reference voltage of each current generator module, each current generator module comprising a digital-to-analog converter configured to receive from the digital processing unit, through a digital bus connecting the digital processing unit to the digital-to-analog converter of each current generator module, a digital regulating signal and to transform the same in an analog voltage signal used as value of the reference voltage, the digital-to-analog converter being configured to be supplied by a shunt type regulator of the current generator module, configured to be connected to said at least one DC main supply, whereby the digital-to-analog converter is configured to be supplied in a floating manner with respect to said at least one DC main supply.

According to a further aspect of the invention, the digital processing unit may be connected to the digital bus through an isolator and voltage level shifter.

According to an additional aspect of the invention, the digital processing unit may be provided with a user interface, comprising display and keyboard, configured to receive commands from an operator and/or with a communication interface configured to connect, optionally through at least one USB port and/or at least one Ethernet port, to a communication network and/or to a PC for receiving remote commands.

According to another aspect of the invention, when the low-noise current source comprises an electrical switching stage, the digital processing unit may be configured to control the electrical switching stage of each current generator module the digital bus also connecting the digital processing unit to the electrical switching stage of each current generator module, whereby the digital processing unit is configured to operate as control stage of the electrical switching stage of each current generator module.

According to a further aspect of the invention, each current generator module may further comprises:

a first temperature sensor, configured to sense a temperature of the digital-to-analog converter, connected to a first analog-to-digital converter configured to digitise an analog temperature sensing signal received from the first temperature sensor and to send the digitised signal to the digital processing unit through the digital bus also connecting the digital processing unit to the first analog-to-digital converter of each current generator module, and a second temperature sensor, configured to sense a temperature of the sensing resistor, connected ad un second analog-to-digital converter configured to digitise an analog temperature sensing signal received from the second temperature sensor and to send the digitised signal to the digital processing unit through the digital bus also connecting the digital processing unit to the second analog-to-digital converter of each current generator module, the digital processing unit being configured to process said digital regulating signal also in function of said digitised signals received from the first and second analog-to-digital converters, whereby the digital processing unit is configured to send said digital regulating signal to the digital-to-analog converter of each current generator module so as to compensate the thermal drifts of the digital-to-analog converter and of the sensing resistor of each current generator module.

According to an additional aspect of the invention, the digital processing unit may be configured to process said digital regulating signal through compensation curves stored in a memory with which the digital processing unit is provided.

In other words, the current source according to the invention uses an architecture, optionally with single supply, wherein the output current is delivered by a component regulating the same current, optionally a power MOSFET, that is controlled through an active feedback loop based on an error amplifier stage, optionally comprising or consisting of an operational amplifier, that carries out the comparison of a reference voltage value with the voltage drop across a sensing resistor (providing an indirect measurement of the output current), and wherein the error amplifier stage is supplied in a floating manner with respect to the DC main supply (including the circuit ground reference) of the source through a shunt type regulator (i.e. a reference voltage regulator comprising a branch between the supply voltage and circuit ground wherein the current flows across a variable resistance component so as to have a constant voltage drop), optionally implemented through a Zener diode connected in series to a current generator, that generates a sort of dedicated supply voltage to the error amplifier stage. This means that the current source according to the invention maintains the entire regulation loop, comprising the operational amplifier and the source of the reference voltage $V_{ref}$, floating. The architecture of the current source according to the invention allows to free the components of the entire regulation loop from the voltage of DC main supply (including the circuit ground reference) of the current source, reducing the noise contribution of the error amplifier stage and, consequently, the whole noise of the current delivered down to levels lower than the so-called shot-noise.

The advantages offered by the current source according to the invention are numerous and significant.

The current source according to the invention is capable to deliver high current (at least equal to some Amperes), with high compliance voltage (at least up to 20 V), with low current noise density (lower than 1 nA/√Hz, with relative noise density lower than 5 parts per $10^{10}$), and with high long term stability. Some embodiments of the current source according to the invention have a digital management of the control signal provided by the regulation loop that also permits to improve the long term stability of the delivered current, thanks to the possibility of compensating the slow fluctuations due to possible thermal drifts.

In other embodiments of the current source according to the invention, a further effect of noise reduction is obtainable by exploiting the modularity and scalability of the source, most of all in the case where particularly high currents are required: under equal efficiency (dissipation), the sum of the currents delivered by parallel modules, controlled by a sole digital signal but with completely uncorrelated analog noises, permits to obtain a whole current noise lower than that obtained by using a sole module with higher current.

Finally, the scalability of the device permits to adapt the compliance voltage to the load without any structural or circuit modification, and independently from the specifications of the used components.

In further embodiments according to the invention, the current source may be supplied through singe main supply, and consequently it is provided with characteristics of compactness and efficiency enabling its use in field measurement contexts. In this case, the possibility of supplying the source circuit with a single battery pack, the efficiency optimisation and the active compensation of thermal variations, render the same suitable to the use for measurements in difficult environmental conditions.

The circuit configuration of the current source according to the invention provides a general and flexible architecture through which it is possible to optimise the performance of the current source without binding its implementation to specific components having special characteristics. In particular, it is possible to adapt the current source circuit to the needs of a wide variety of loads without changing the whole circuit configuration.

The present invention will be now described, by way of illustration and not by way of limitation, according to its preferred embodiments, by particularly referring to the Figures of the annexed drawings, in which:

FIG. 2 shows a circuit diagram of greater detail of the first prior art current source of FIG. 1a (FIG. 2a) and a simplified circuit diagram for carrying out an analysis of the current noise thereof (FIG. 2b);

In the Figures identical reference numerals will be used for alike elements.

Figure 3:
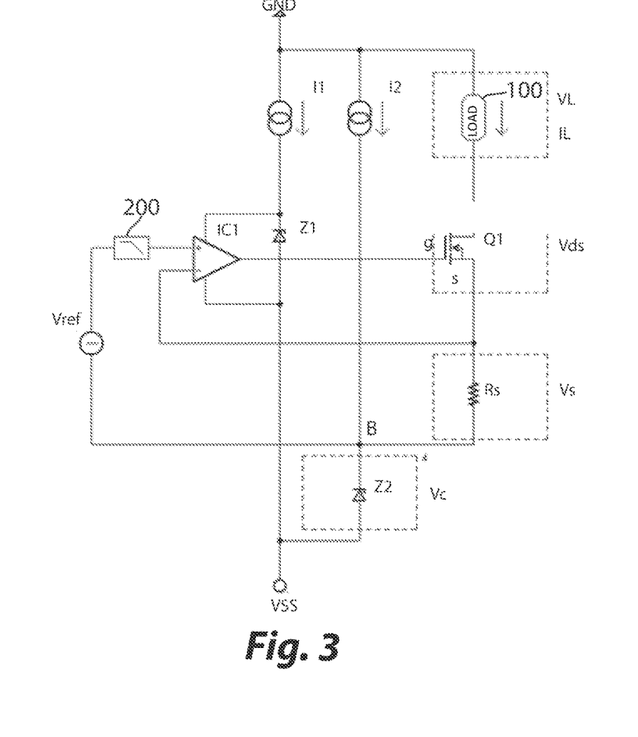
FIG. 3 shows a first embodiment of the current source according to the invention.

A first embodiment of the current source according to the invention uses a single main supply circuit architecture, shown in FIG. 3 (immediately comprehensible to those skilled in the art), wherein the error amplifier stage comprises an operational amplifier IC1 (that receives the reference voltage $V_{ref}$ at the non-inverting input and the voltage drop $V_s$, across the sensing resistor $R_s$ at the inverting input) supplied in a floating manner through a shunt type regulator implemented through a Zener diode Z1, connected in series to a current generator I1, that generates across the Zener diode Z1 a sort of dedicated supply voltage always maintaining the operational amplifier IC1 within the specifications for low noise; also, the current source shown in FIG. 3 delivers an output current for driving a QCL 100 (represented as a generic load) in Anode-Ground configuration. The operational amplifier IC1 is configured to output the error signal (equal to the difference between the reference voltage $V_{ref}$ at the non-inverting input and the voltage drop $V_s$ across the sensing resistor $R_s$ at the inverting input) that is amplified and controls the regulating MOSFET Q1 so as to deliver the output current $I_L$. However, it must be noted that other embodiments of the current source according to the invention may use a dual main supply, instead of a single one, and/or may comprise amplifier stages different from that shown in FIG. 3, and/or may use shunt type regulators different from Zener diodes connected in series to current generators, and/or may be configured to drive a QCL in Cathode-Ground configuration, and/or may be also applied for driving any load, even different from a QCL, still remaining within the scope of protection of the invention as defined in the attached claims. Moreover, also the current source of FIG. 3 advantageously comprises (most of all when the reference voltage $V_{ref}$ input at the non-inverting terminal of the operational amplifier IC1 is noisy) a low-pass filter 200 filtering the reference voltage $V_{ref}$ input at the non-inverting terminal of the operational amplifier IC1, where the low-pass filter 200 may be a filter of any order, optionally of second order, more optionally of third order (in particular, the more noisy the reference voltage $V_{ref}$ is, the higher order of the filter is advantageous).

With reference to FIG. 3, it may be observed that the current source according to the invention differs from the circuit architecture of the prior art amplifier shown in FIG. 2a in that the operational amplifier IC1 is supplied through a Zener diode Z1 and a current generator I1, connected in series between circuit ground and a negative DC main supply voltage $V_{ss}$, and in that also the additional voltage drop V (operating as second reference voltage) between the negative main supply voltage $V_{ss}$ and node B is generated in the same manner through a second shunt type regulator implemented through a second Zener diode Z2 and a second current generator I2, connected in series between circuit ground and the negative main supply voltage $V_{ss}$; in particular, node B constitutes an end of the sensing resistor $R_s$ and, more generally, an end of the series branch including load 100, MOSFET Q1 (controlled by the output of the operational amplifier IC1) and sensing resistor $R_s$ and the other end of which is connected to circuit ground, while the additional voltage drop V is used for regulating the compliance voltage $V_{comp}$ between circuit ground and node B, that is equal to the sum of the voltage drops $V_L$, $V_{ds}$ and $V_s$, respectively across the load, the MOSFET Q1, and the sensing resistor $R_s$, so as to guarantee the control of the output current $I_L$ for low values of the same current $I_L$. The generation of the voltage supplying the operational amplifier IC1 and of the additional voltage drop $V_c$ permits to free the entire regulating block (comprising the operational amplifier IC1, the source of the reference voltage $V_{ref}$, and the generator of the additional voltage drop $V_c$) from the DC main supply (including the circuit ground reference), rendering the maximum output voltage $V_L$ available to the load 100 fully scalable, by simply varying the value of the negative main supply voltage $V_{ss}$, without needing any other structure and circuit modification, and maintaining the supply requirements of the operational amplifier IC1 unchanged, with the latter that always works within its specifications maintaining its own low noise characteristics unchanged.

Such architecture is particularly flexible even in controlling noise reduction. In fact, the possibility of freely increasing the negative main supply voltage $V_s$, permits to increase the value of the resistance R of the sensing resistor $R_s$, with the consequent output current noise reduction, with no loss of dynamics of the output voltage $V_L$ across load 100.

Moreover, the circuit architecture of the current source of FIG. 3 permits to adopt a single battery main supply, differing from all the circuit architectures of similar prior art current sources which are always necessarily based on fixed bipolar supplies, such as those with ±24 V supply voltages. This characteristic of the invention may be of great importance in field applications, for which weight and size are highly binding aspects.

As already stated, the circuit architecture of the current source of FIG. 3 may be immediately and simply adapted by those skilled in the art for driving a QCL in Cathode-Ground configuration, obtaining the same advantages illustrated for the source of FIG. 3, on the basis of the teachings given, i.e. by having the operational amplifier, the output of which is connected to the gate of the p-channel MOSFET and that is thus configured to control the gate (and hence the operation) of the MOSFET, that is supplied through a Zener diode and a current generator connected to each other in series between a positive DC main supply voltage and circuit ground, and by also having the additional voltage drop (between the positive DC main supply voltage and the node at an end of the series branch comprising the sensing resistor $R_s$, the MOSFET, and the load, the other end of which is connected to circuit ground) that is generated in the same manner through a second Zener diode and a second current generator connected in series between the positive DC main supply voltage and circuit ground.

The circuit architecture of the current source of FIG. 3 may be modified to implement other embodiments of the current source according to the invention, supplementing the latter with advantageous optional features.

Figure 4:
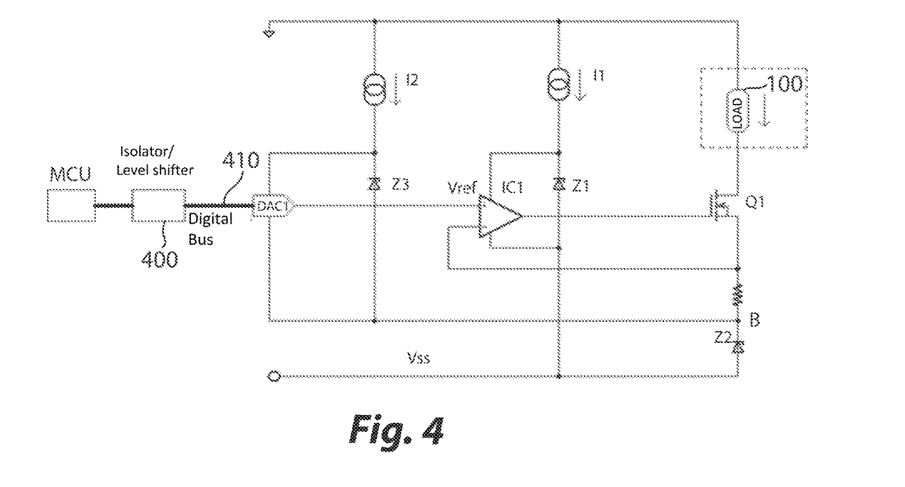
FIG. 4 shows a second embodiment of the current source according to the invention.
Figure 5:
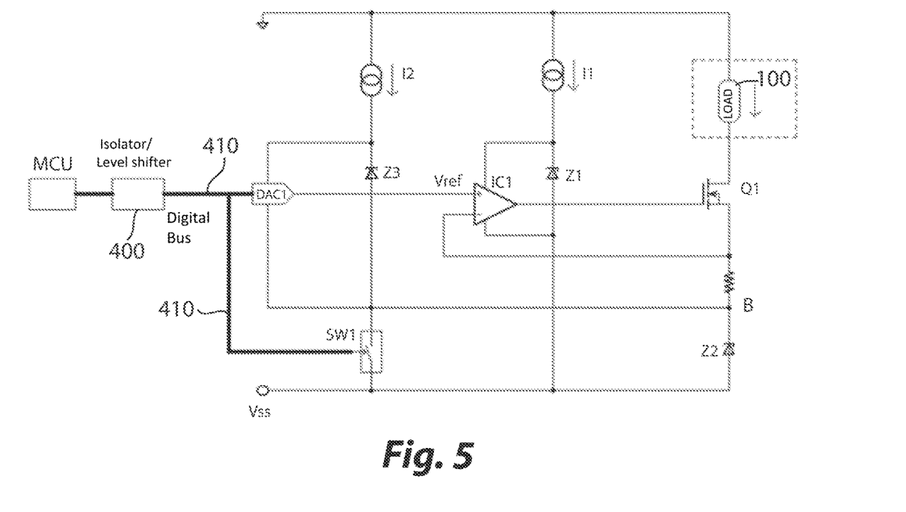
FIG. 5 shows a third embodiment of the current source according to the invention.
Figure 6:
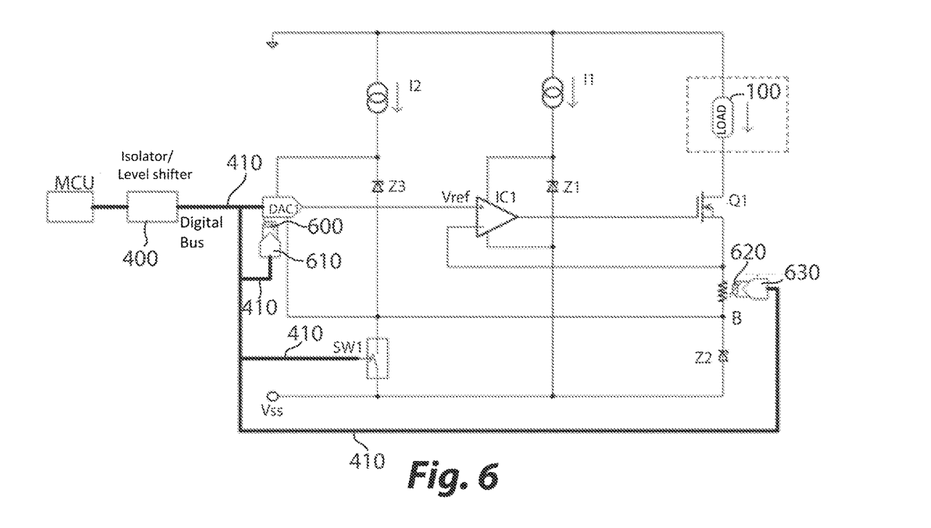
FIG. 6 shows a fourth embodiment of the current source according to the invention.
Figure 7:
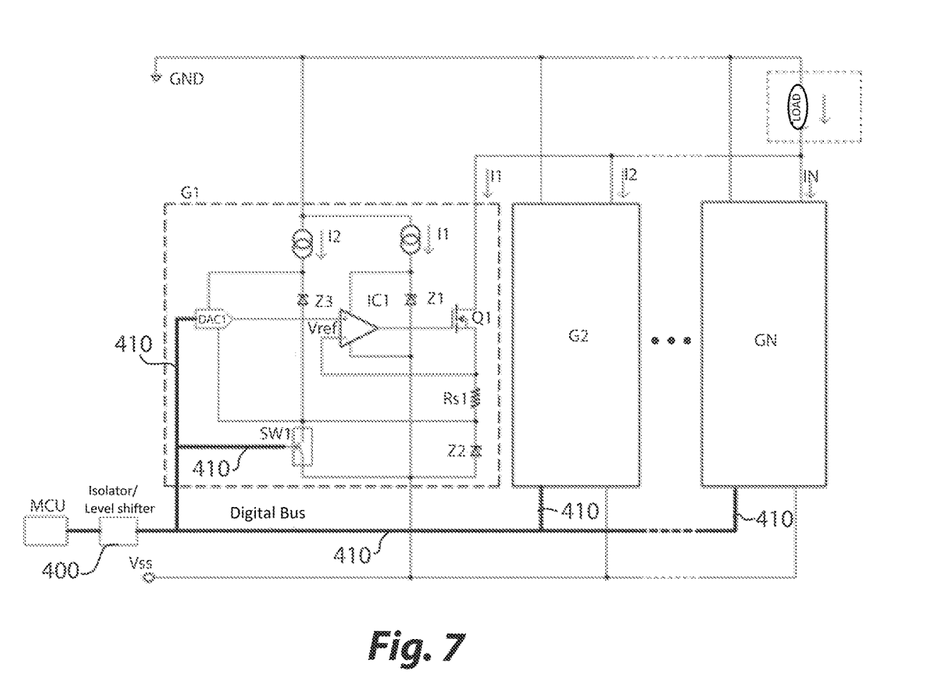
FIG. 7 shows a fifth embodiment of the current source according to the invention.

With reference to FIG. 4, it may be observed that a second embodiment of the current source according to the invention differs from the source of FIG. 3 in that it comprises a digital interface regulating the value of the reference voltage $V_{ref}$ (that, in the source of FIG. 3, is usually generated in analog manner). In particular, the digital interface of the current source of FIG. 4 comprises a microcontroller MCU (or a different digital processing unit) that sends, through a (e.g. optical) isolator and voltage level shifter 400 and a digital bus 410, a digital regulating signal to a digital-to-analog converter DAC1 that transforms the same in an analog voltage signal, sent to the non-inverting terminal of the operational amplifier IC1, which analog signal is used as value of the reference voltage $V_{ref}$. Although not shown in FIG. 4, also the current source with digital control of FIG. 4 is advantageously provided (most of all when the reference voltage at the input non-inverting terminal of the operational amplifier IC1 is noisy) with a low-pass filter (similar to the filter 200 of the source of FIG. 3) filtering the (analog) reference voltage at the input non-inverting terminal of the operational amplifier IC1 (such low-pass filter could be integrated into the digital-to-analog converter DAC1); although not shown in FIGS. 5-7 illustrating further embodiments of the current source with digital control according to the invention, it must be understood that such low-pass filter may be similarly present also in such further embodiments of the current source according to the invention. In particular, the digital-to-analog converter DAC1 is also supplied by the second shunt type regulator that generates a second dedicated supply voltage, through a third Zener diode Z3 connected in series between the second current generator I2 and the second Zener diode Z2; it must be noted that the digital-to-analog converter DAC1 may be configured to be supplied by a different shunt type regulator so as to be supplied in a floating manner with respect to the DC main supply (including the circuit ground reference) of the source, for instance it may be configured to be supplied by its own shunt type regulator, implemented through the series-connected third Zener diode and a third current generator (connected in series between circuit ground and the negative main supply voltage V), or it may be configured to be supplied also by the same Zener diode Z1 connected in series to the current generator I1, whereby the digital-to-analog converter DAC1 would be supplied by the same dedicated supply voltage that supplies the operational amplifier IC1. The presence of the digital interface permits to configure the generator both for an at-bench use (by providing it with user interface comprising display and keyboard, configured to receive commands from an operator) and for a remote use (through a communication interface, with which the microcontroller MCU is provided, configured to connect, optionally through at least one USB port and/or at least one Ethernet port, to a communication network and/or to a PC and by remotely sending commands through the most common communication protocols).

FIG. 5 shows a third embodiment of the current source according to the invention having a circuit architecture that allows to optimise the efficiency thereof, although the source is still supplied by a single main supply (i.e. with single battery). In fact, turning back to consider the source of FIG. 3, it may be observed that, when the output current $I_L$ increases, a current threshold value $I_{th}$ is reached beyond which the presence of the additional voltage drop V is no more necessary, since the voltage $V_{gs}$ is in any case within the dynamic range of the operational amplifier IC1; this is applicable also to the source of FIG. 4. Consequently, when the output current $I_L$ is higher than or equal to the current threshold value $I_{th}$, it is possible to eliminate the second Zener diode Z2 (or, better, to disconnect the same from the sensing resistor $R_s$), thus excluding a no more necessary dissipative element and recovering voltage available to the load at high output currents $I_L$. To this end, the current source of FIG. 5 comprises a switch SW1 (or any electrical switching component or stage having an open configuration and a closed configuration) connected in parallel to the second Zener diode Z2, normally open, controlled by the microcontroller MCU through the digital bus 410 downstream of the isolator and voltage level shifter 400. When the microcontroller MCU recognises (possibly, but not necessarily, also by sensing by means of a current sensor) that the output current $I_L$ is higher than or equal to a maximum current value $I_{max}$, in turn higher than or equal to the current threshold value $I_{th}$, the same microcontroller MCU closes the switch SW1 disconnecting the second Zener diode Z2; when, on the contrary, the microcontroller MCU recognises that the output current $I_L$ is lower than or equal to a minimum current value $I_{min}$, in turn higher than or equal to the current threshold value $I_{th}$ and lower than or equal to the maximum current value $I_{max}$, the microcontroller MCU re-opens (or opens) the switch SW1 re-connecting (or connecting) the second Zener diode Z2. In particular, when the minimum and maximum current values $I_{min}$ and $I_{max}$ are different from each other, the microcontroller MCU controls the switch SW1 by reducing the switching frequency thereof in the case where the output current $I_L$ is variable around the current threshold value $I_{th}$.

Other embodiments of the current source according to the invention may be provided with the switch SW1 (connected in parallel to the second Zener diode Z2) independently from the presence of the digital interface, and/or they may have a component or stage controlling the switch SW1 different from the microcontroller MCU, for instance a MOSFET the gate of which is controlled by the value of output current $I_L$ (e.g. sensed on the sensing resistor $R_s$).

FIG. 6 shows a fourth embodiment of the current source according to the invention having a circuit architecture that allows to digitally compensate thermal drifts, ensuring a long term stability of the output current $I_L$ that is delivered to the load 100. In particular, such long term stability heavily depends on the stability of the reference voltage $V_{ref}$ that for the embodiments of FIGS. 4 and 5 in turn depends on the thermal drifts of the digital-to-analog converter DAC1, and on the stability of the voltage drop $V_{Rs}$ across the sensing resistor $R_s$, that in turn depends on the thermal drifts of the same sensing resistor $R_s$. For applications in environments where temperature is kept within a range of few Kelvin degrees, the stability of the common commercial components (specifically digital-to-analog converters and resistors) is generally sufficient to guarantee a long term stability of the output current $I_L$ of few ppm (parts per million). Differently, for field applications, where temperature variations may be very large, most of all in extreme operating conditions, a correction of the thermal effects may be necessary. The circuit architecture of the source of FIG. 6 is configured to implement such compensation; in particular, the source of FIG. 6 is provided with the switch SW1, similarly to the source of FIG. 5, but it must be noted that the circuit portion dedicated to the digital compensation of thermal drifts may be also applied to the source of FIG. 4. Making reference to FIG. 6, a first temperature sensor 600 senses the temperature of the digital-to-analog converter DAC1 and a second temperature sensor 620 senses the temperature of the sensing resistor $R_s$; the analog signals of the temperature sensing of the first and second sensors 600 and 620 are digitised by a first and a second analog-to-digital converter, respectively 610 and 630, and sent through the digital bus 410 to the microcontroller MCU. The digital-to-analog converter DAC1 and the sensing resistor $R_s$ are preliminarily temperature characterised and the respective compensation curves are stored in the memory of the microcontroller MCU. During the source operation, the analog signals of the temperature sensing of the digital-to-analog converter DAC1 and of the sensing resistor Rs, along with the related stored compensation curves, are used by the microcontroller MCU for calculating (i.e. processing) the digital regulating signal to send to the digital-to-analog converter DAC1 for generating the analog signal of the reference voltage $V_{ref}$ corrected so as to compensate the thermal drifts of the digital-to-analog converter DAC1 and of the sensing resistor $R_s$.

Moreover, indicating the "true" value of the output current $I_L$ of the source to be obtained with $I_{set}$, and the value of the reference voltage that must be generated by the digital-to-analog converter DAC1 at a given temperature $T_0$ with $V_{r0}$, in order to obtain the corrected value of the reference voltage $V_{ref}$, assuming that the values of the resistance R of the sensing resistor $R_s$ and of the analog signal from the digital-to-analog converter DAC1 vary linearly with the temperature around the values $R_0$ and $V_{r0}$ (assumed when the temperature T is equal $T_0$) according to coefficients $k_{DAC}$ and $k_R$, respectively, the microcontroller MCU could also take account of the following relationships in processing the digital regulating signal to send to the digital-to-analog converter DAC1:

$$V_{ref} = I_{set} R \quad [11]$$

$$V_{ref} = V_{r0} \cdot (1 + k_{DAC} \Delta T_{meas\_600}) \quad [12]$$

$$R = R_0 \cdot (1 + k_R \Delta T_{meas\_620}) \quad [13]$$

where $\Delta T_{meas\_600}$ is the difference between the temperature $T_{meas\_600}$ sensed by the first temperature sensor 600 and the temperature $T_0$ ($\Delta T_{meas\_600} = T_{meas\_600} - T_0$) and $\Delta T_{meas\_620}$ is the difference between the temperature $T_{meas\_620}$ sensed by the second temperature sensor 620 and the temperature $T_0$ ($\Delta T_{meas\_620} = T_{meas\_620} - T_0$); in this regard, the coefficients $k_{DAC}$ and $k_R$ have values of the order of few parts per million (i.e. of the order of $10^{-5}$).

Moreover, even the first and second analog-to-digital converters 610 and 630 used to digitise the temperatures sensed by the first and second sensors 600 and 620, respectively, have their own thermal coefficients, respectively $k_{ADC\_610}$ and $k_{ADC\_630}$, whereby the microcontroller MCU could also take account of the fact that the temperature differences $\Delta T_{meas\_600}$ and $\Delta T_{meas\_620}$ digitised by the first and second analog-to-digital converters 610 and 630, respectively, may be expressed as follows:

$$\Delta T_{meas\_600} = \Delta T_{meas0\_600} \cdot (1 + k_{ADC\_610} \Delta T_{effective\_600}) \quad [14]$$

$$\Delta T_{meas\_600} = \Delta T_{meas0\_600} (1 + k_{ADC\_610} \Delta T_{effective\_600}) \quad [15]$$

However, by inserting the relationships [14] and [15] into the relationships [12] and [13], it is possible to observe that the corrections to the temperature values digitised by the first and second analog-to-digital converters 610 and 630 contribute to the values of the reference voltage $V_{ref}$ and of the resistance R with second order terms in the thermal coefficients, which terms are hence much lower than the first order corrections in the relationships [12] and [13], whereby the microcontroller MCU may neglect them.

Using an at least 20 bit digital-to-analog converter DAC1, the digital compensation of the thermal drifts of the digital-to-analog converter DAC1 and of the sensing resistor $R_s$ performed by the microcontroller MCU guarantees a long term stability of the output current $I_L$ of the source of FIG. 6 of the order of 1 ppm, independently from the variations of temperature of the external environment.

FIG. 7 shows a fifth embodiment of the current source according to the invention having a circuit architecture that allows to reduce the noise and to distribute the power dissipated on a plurality of N identical current generator modules (indicated in FIG. 7 with the reference signs $G_1$, $G_2$, ... $G_N$) operating in parallel (since they are connected in parallel) and controlled by a sole microcontroller MCU, whereby the output current $I_L$ is equal to the sum of the output currents $I_i$ of the single current generator modules; in particular, the single current generator modules of the source of FIG. 7 have the circuit architecture of the source of FIG. 5, but it must be noted that they could also have the circuit architecture of the source of FIG. 4 or of the source of FIG. 6 (in this case, the microcontroller MCU should compensate the thermal drifts of each single module, for instance by limiting the computational burden by directly reading the compensation curves stored in the memory of the same microcontroller MCU). Under equal output current $I_L$, that is delivered to the load 100, and equal total dissipated power, the modular architecture of the source of FIG. 7 permits a further reduction of the noise of the output current $I_L$. In fact, given a whole output current $I_L$, with total current noise density $I_{noise\_N}$, each module i of the N current generator modules of the source of FIG. 7 delivers an output current $I_i$ equal to $$I_i = (I_L / N)$$

It is possible to maintain the same dissipation on the single sensing resistors $R_{s\_i}$ of the N current generator modules by increasing the value of their resistance $R_i$ by a factor N with respect to the value of the resistance R of the sensing resistor $R_s$ of the single module source of FIG. 5:

$$R_i = N \cdot R$$

Since, as shown, the noise introduced by the operational amplifier IC1 is dominant, this causes the current noise density $I_{noise\_i}$ of each single module to be reduced by a factor N with respect to the current noise density $I_{noise}$ of the single module source of FIG. 5 (see equation [3]):

$$I_{noise\_i} = V_{namp} / R_N = V_{namp} / NR = \frac{1}{N} \cdot I_{noise} \quad [16]$$

Moreover, the noises of different modules are uncorrelated with each other, since the input voltage noises of the single operational amplifiers IC1 of the single modules (having voltage noise density $V_{namp}$) are uncorrelated with each other. Since not correlated noises add in quadrature, the total current noise density $I_{noise\_N}$ (and consequently the total current noise) of the amplifier of FIG. 7 having N identical modules operating in parallel is equal to:

$$I_{noise\_N} = \sqrt{\Sigma_N (I_{noise}/N)^2} = \sqrt{N \cdot (I_{noise}/N)^2} = I_{noise}/\sqrt{N} \quad [17]$$

Thus, it is possible, under equal total dissipation, to obtain a reduction of the current noise by a factor $1/\sqrt{N}$, and a better distribution of dissipated power.

Further embodiments of the current source according to the invention may also comprise a plurality of N identical current generator modules operating in parallel (since they are connected in parallel), whereby the output current $I_L$ is equal to the sum of the output currents $I_i$ of the single current generator modules, wherein the single current generator modules of the source have each the circuit architecture of the source of FIG. 3, i.e. even without digital interface. In this case, the current generator modules may be driven by a sole analog reference voltage $V_{ref}$, the current source being particularly efficient from the point of view of power consumption. Alternatively, each one of the current generator modules could be driven by a respective analog reference voltage $V_{ref}$ that would be regulated simultaneously with the reference voltages of the other modules (e.g. through respective analog or digital potentiometers simultaneously adjusted through a mechanical or electronic adjusting system).

As already stated, other embodiments of the current source according to the invention may use at least one DC main supply, instead of a single main supply, for instance they may use a dual main supply. In this regard, said at least one DC main supply may use at least one battery or not; for instance, it could also use one or more DC supplies obtained from a supply stage in turn connected to the mains or to an AC supply. In particular, in the case where two or more DC main supplies are used, the current source according to the invention offers the advantage of making connection of the circuit ground to any circuit node, advantageously constituted by one of the two terminals of the load (e.g. a QCL), possible.

In conclusion, the current source according to the invention is capable to deliver high current, at least up to 2 A, with high compliance voltage, at least up to 20 V, with current noise density lower than 1 nA/$\sqrt{Hz}$, optionally not larger than 400 pA/$\sqrt{Hz}$, optionally having a digital control, easily scalable, reliable and efficient thanks to its modularity. Moreover, the current source according to the invention may be supplied through battery, optionally through single main supply, and it can be made in a simple, compact and, consequently, inexpensive manner. Furthermore, the current source according to the invention is particularly efficient from the point of view of power consumption.

The current source according to the invention may be applied as DC source for quantum cascade lasers (QCLs) operating in the spectral regions of mid-infrared and of TeraHertz band. Moreover, thanks to the characteristic of extremely low noise, the current source according to the invention may be advantageously used in the applications of QCLs wherein such characteristic is particularly important, as in high precision and sensitivity spectroscopy. Also, the characteristics of compactness, lightweight and energy efficiency of the current source according to the invention allow its use in field instruments based on spectroscopy or imaging with QCL, such as gas sensors or portable spectrometers to use in terrestrial-, airborne- or space-based missions. In any case, the current source according to the invention may be used in any application for driving any load, even different from a QCL, wherein at least one of the advantageous characteristics illustrated above may be usefully exploited.

The preferred embodiments of this invention have been described and a number of variations have been suggested hereinbefore, but it should be understood that those skilled in the art can make other variations and changes without so departing from the scope of protection thereof, as defined by the attached claims.

The invention claimed is:

1. A low-noise current source, configured to be supplied by at least one DC supply and to deliver an output current, the source comprising one or more current generator modules operating in parallel, each one of which is configured to deliver a respective output current, whereby the output current of the source is equal to the sum of the output currents delivered by said one or more current generator modules, each current generator module comprising:
a regulator component configured to deliver the output current of the current generator module,
a sensing resistor connected in series to the regulator component, and
an error amplifier stage configured to compare a reference voltage with a voltage drop across the sensing resistor, whereby the error amplifier stage is configured to amplify an error signal equal to a difference between the reference voltage and the voltage across the sensing resistor, the error amplifier stage being configured to output the amplified error signal that is configured to control the regulator component,
a first shunt type regulator configured to be connected to said at least one DC supply, that is further configured to generate a dedicated supply voltage supplying the error amplifier stage, whereby the error amplifier stage is configured to be supplied in a floating manner with respect to said at least one DC supply; and
a second shunt type regulator configured to be connected to said at least one DC supply, that is further configured to generate a second reference voltage on one end of the sensing resistor not connected to the regulator component.

2. The low-noise current source according to claim 1, wherein the first shunt type regulator comprises a first Zener diode and a first current generator connected in series to each other and configured to generate said dedicated supply voltage across the first Zener diode.

3. The low-noise current source according to claim 1, wherein the second shunt type regulator comprises a second Zener diode and a second current generator connected in series to each other and configured to generate the second reference voltage across the second Zener diode.

4. The low-noise current source according to claim 3, wherein each current generator module further comprises an electrical switching stage connected in parallel to the second Zener diode, the electrical switching stage being configured to assume an open configuration, in which it does not allow current to flow, or a closed configuration, in which it allows current to flow, upon control of a control stage, the control stage being configured to control the electrical switching stage so that, when the output current of the current generator module is higher than or equal to a maximum current value $I_{max}$, in turn higher than or equal to a current threshold value $I_{th}$, the electrical switching stage assumes said closed configuration, whereby the second Zener diode is disconnected from the sensing resistor, and so that, when the output current of the current generator module is lower than or equal to a minimum current value $I_{min}$, in turn higher than or equal to the current threshold value $I_{th}$ and lower than or equal to the maximum current value $I_{max}$, the electrical switching stage assumes said open configuration.

5. The low-noise current source according to claim 1, wherein the error amplifier stage comprises an operational amplifier configured to receive at a non-inverting input the reference voltage and at an inverting input the voltage drop across the sensing resistor.

6. The low-noise current source according to claim 1, wherein the regulator component comprises or consists of a MOSFET, the gate of which is connected to said output of the error amplifier stage, whereby the amplified error signal output by the error amplifier stage is configured to control the gate of the MOSFET.

7. The low-noise current source according to claim 1, further comprising a digital interface comprising a digital processing unit configured to regulate the reference voltage of each current generator module, each current generator module comprising a digital-to-analog converter configured to receive from the digital processing unit, through a digital bus connecting the digital processing unit to the digital-to-analog converter of each current generator module, a digital regulating signal and to transform the same into an analog voltage signal used as a value of the reference voltage, the digital-to-analog converter being configured to be supplied by a shunt type regulator of the current generator module, configured to be connected to said at least one DC supply, whereby the digital-to-analog converter is configured to be supplied in a floating manner with respect to said at least one DC supply.

8. The low-noise current source according to claim 7, wherein the digital processing unit is connected to the digital bus through an isolator and voltage level shifter.

9. The low-noise current source according to claim 7, wherein the digital processing unit is provided with a user interface comprising a display and a keyboard configured to receive commands from an operator, and/or with a communication interface configured to connect to a communication network and/or to a PC for receiving remote commands.

10. The low-noise current source according to claim 3, wherein each current generator module further comprises an electrical switching stage connected in parallel to the second Zener diode, the electrical switching stage being configured to assume an open configuration in which it does not allow current to flow, or a closed configuration in which it allows current to flow, upon control of a control stage, the control stage being configured to control the electrical switching stage so that, when the output current of the current generator module is higher than or equal to a maximum current value $I_{max}$, in turn higher than or equal to a current threshold value $I_{th}$, the electrical switching stage assumes said closed configuration, whereby the second Zener diode is disconnected from the sensing resistor, and so that, when the output current of the current generator module is lower than or equal to a minimum current value $I_{min}$, in turn higher than or equal to the current threshold value $I_{th}$ and lower than or equal to the maximum current value $I_{max}$, the electrical switching stage assumes said open configuration, wherein the low-noise current source further comprises a digital interface comprising a digital processing unit configured to regulate the reference voltage of each current generator module, each current generator module comprising a digital-to-analog converter configured to receive from the digital processing unit, through a digital bus connecting the digital processing unit to the digital-to-analog converter of each current generator module, a digital regulating signal and to transform the same into an analog voltage signal used as a value of the reference voltage, the digital-to-analog converter being configured to be supplied by a shunt type regulator of the current generator module, configured to be connected to said at least one DC supply, whereby the digital-to-analog converter is configured to be supplied in a floating manner with respect to said at least one DC supply, wherein the digital processing unit is configured to control the electrical switching stage of each current generator module through the digital bus also connecting the digital processing unit to the electrical switching stage of each current generator module, whereby the digital processing unit is configured to operate as control stage of the electrical switching stage of each current generator module.

11. The low-noise current source according to claim 7, wherein each current generator module further comprises:
   a first temperature sensor, configured to sense a temperature of the digital-to-analog converter, connected to a first analog-to-digital converter configured to digitise an analog temperature sensing signal received from the first temperature sensor and to send the digitised signal to the digital processing unit through the digital bus also connecting the digital processing unit to the first analog-to-digital converter of each current generator module, and
   a second temperature sensor, configured to sense a temperature of the sensing resistor, connected to a second analog-to-digital converter configured to digitise an analog temperature sensing signal received from the second temperature sensor and to send the digitised signal to the digital processing unit through the digital bus also connecting the digital processing unit to the second analog-to-digital converter of each current generator module,
   the digital processing unit being configured to process said digital regulating signal also in function of said digitised signals received from the first and second analog-to-digital converters, whereby the digital processing unit is configured to send said a digital regulating signal to the digital-to-analog converter of each current generator module so as to compensate the thermal drifts of the digital-to-analog converter and of the sensing resistor of each current generator module.

12. The low-noise current source according to claim 11, wherein the digital processing unit is configured to process said digital regulating signal through compensation curves stored in a memory with which the digital processing unit is provided.

13. The low-noise current source according to claim 4, wherein said electrical switching stage comprises a switch.

14. The low-noise current source according to claim 7, wherein said digital processing unit comprises a microprocessor.

15. The low-noise current source according to claim 7, wherein the digital processing unit is provided with a communication interface configured to connect, through at least one USB port and/or at least one Ethernet port, to a communication network and/or to a PC for receiving remote commands.

\* \* \* \* \*